(12) United States Patent
Adra

(10) Patent No.: US 12,579,338 B2
(45) Date of Patent: Mar. 17, 2026

(54) TRANSITIONING SIMULATION ENTITIES BETWEEN SMART ENTITY STATUS AND DISCRETE ENTITY STATUS

(71) Applicant: CreateASoft, Inc., Aurora, IL (US)

(72) Inventor: Hosni I. Adra, Naperville, IL (US)

(73) Assignee: CreateASoft, Inc., Aurora, IL (US)

( * ) Notice: Subject to any disclaimer, the term of this patent is extended or adjusted under 35 U.S.C. 154(b) by 1143 days.

(21) Appl. No.: 17/539,027

(22) Filed: Nov. 30, 2021

(65) Prior Publication Data

US 2023/0169227 A1 Jun. 1, 2023

(51) Int. Cl.
G06F 7/48 (2006.01)
G06F 30/20 (2020.01)

(52) U.S. Cl.
CPC .................................... G06F 30/20 (2020.01)

(58) Field of Classification Search
CPC .. G05B 19/41885; G06F 30/20; G08G 1/165; G08G 1/166
See application file for complete search history.

(56) References Cited

PUBLICATIONS

Gerrits, Berry, Martijn Mes, and Peter Schuur. "A simulation model for the planning and control of AGVs at automated container terminals." 2018 Winter Simulation Conference (WSC). IEEE, 2018. (Year: 2018).*

Ma, Ning, Chenhao Zhou, and Aloisius Stephen. "Simulation model and performance evaluation of battery-powered AGV systems in automated container terminals." Simulation Modelling Practice and Theory 106 (2021): 102146. (Year: 2021).*

Zhang, Zheng, et al. "Collision-free route planning for multiple AGVs in an automated warehouse based on collision classification." IEEE access 6 (2018): 26022-26035. (Year: 2018).*

* cited by examiner

*Primary Examiner* — Nithya J. Moll

(74) *Attorney, Agent, or Firm* — Seed Intellectual Property Law Group LLP

(57) ABSTRACT

A facility for transitioning simulated entities between smart entity status and discrete entity status is described. The facility obtains an indication of a simulation model representing a complex and identifies transitioning constraints and entities in the simulation model. Each of the entities has an initial entity status which identifies the entity as a discrete entity or a smart entity. The facility implements the simulation model to simulate the movement of the identified entities and determines whether the status of a distinguished entity should change based on the transitioning constraints. In response to the determining, the facility changes the status of the distinguished entity.

24 Claims, 8 Drawing Sheets

450 table of entities transitioning
from smart to discrete

| Entity ID |
|-----------|
| 9999 |
| 1010 |
| ••• |

400 table of entities transitioning
from discrete to smart

| Entity ID |
|-----------|
| 1111 |
| 2222 |
| ••• |

Begin

Determine that the status of an entity is to change     *501*

Identify the location of the entity     *502*

Pass an identifier for the entity and the location of the entity to another engine     *503*

End shared engine data table

600

| Entity ID | Location | Entity Type | Entity Attributes | Entity transition constraints |
|---|---|---|---|---|
| 1111 | X=20 Y=40 Z=2 | AGV | Size: 10'x10'x5" Collision radius: 1' Speed: 10mph Battery capacity: 5 hours | • Moving to or from picking station = smart<br>• Battery capacity under 20 minutes = discrete<br>• Moving from assembly station to loading station = discrete  601 |
| 2222 | X=30 Y=10 Z=10 | Picker | Size: 5.8'x1.5'x1' Collision space: 1' Speed: 3mph Load capacity: 30lbs | • Moving to or from picking station = smart<br>• Moving from assembly station to loading station = discrete<br>• Shift has ended = smart  602 |
| 3333 | X=27 Y=4 Z=24 | Forklift | Size: 8'x8'x5" Collision radius: 1' Speed: 10mph load capacity: 400lbs | • Moving to or from picking station = smart<br>• Moving from assembly station to loading station = discrete<br>• Entered area bounded by: X:10-30 Y:0-20 = smart  603 |
| ...  620 | ...  621 | ...  622 | ...  623 | ...  624 |

*FIG. 6*

TRANSITIONING SIMULATION ENTITIES BETWEEN SMART ENTITY STATUS AND DISCRETE ENTITY STATUS

BACKGROUND

A simulation model representing a factory, fulfillment center, or other complex typically simulates various mobile entities, such as: people, such as workers in the complex, customers, visitors, etc.; vehicles, such as automated vehicles, for example, an Automated Guided Vehicle (an AGV), vehicles operated by a person, etc.; objects, such as objects being processed in the complex, objects used in the complex, etc.; and other entities which may be included in, a part of, used by, etc., a complex. A discrete entity uses a pre-defined path within the complex. A smart entity plots its own path based on other entities, installations in the complex, the environment around the entity, a spatial representation of its surroundings, etc.

BRIEF DESCRIPTION OF THE SEVERAL VIEWS OF THE DRAWINGS

FIG. 4a is a table diagram depicting a table of entities transitioning from discrete to smart used by the facility in some embodiments.

FIG. 4b is a table diagram depicting a table of entities transitioning from smart to discrete used by the facility in some embodiments.

FIG. 6 is a table diagram depicting a shared engine data table used by the facility in some embodiments.

DETAILED DESCRIPTION

Figure 1:
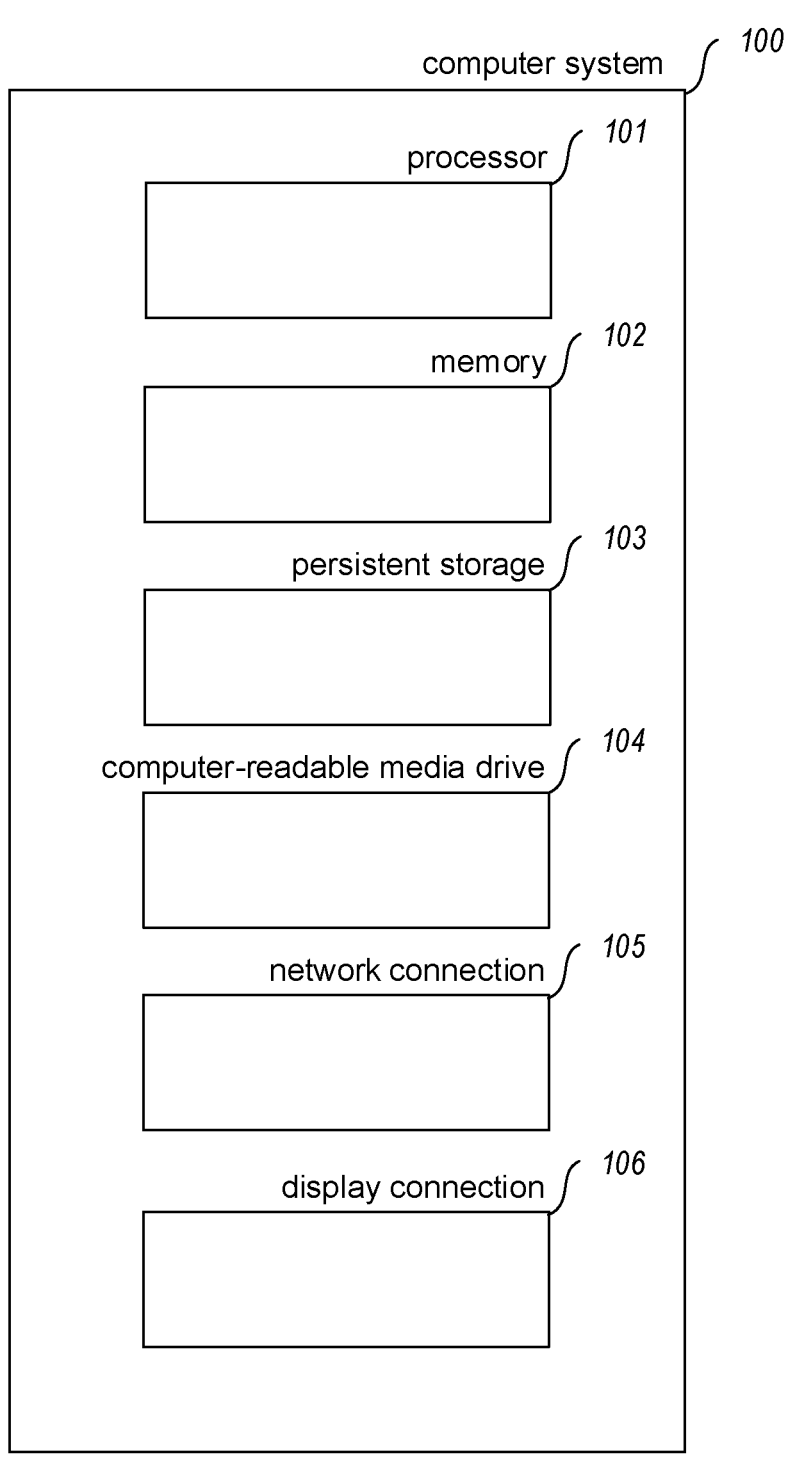
FIG. 1 is a block diagram showing some of the components typically incorporated in at least some of the computer systems and other devices on which the facility operates.

The inventor has recognized that it would be of great benefit to simulation engineers, managers of simulated complexes, etc., to utilize both smart entities and discrete entities in a coordinated simulation of a complex. The inventor has also determined that it would be beneficial to allow an entity to transition between states, such that it can function as a smart entity at times and as a discrete entity at other times.

The inventor has recognized a variety of disadvantages of current simulation software and practices to using smart entities. Typical simulation software used to simulate a complex is unable to simulate entities that transition between a smart entity and discrete entity. Thus, each entity in typical simulation software is fixed as either a smart entity or a discrete entity. Furthermore, no simulation software can operate a model which includes both smart and discrete entities. While it may be possible for a smart entity to be forced to act like a discrete entity, or vice versa, with typical simulation software, the simulation is forced to incur meaningful inaccuracies when this is done.

In response to recognizing these disadvantages, the inventor has conceived and reduced to practice a software and/or hardware facility for transitioning entities between smart entity status and discrete entity status within a simulated environment. By using multiple simulation engines that communicate with each other, for example, by modifying a single shared state of the simulation, the facility enables a user to define and simulate entities that transition from discrete entity status to smart entity status, and vice versa. The facility additionally allows a user to define constraints that control when an entity transitions from a discrete entity status to a smart entity status, or vice versa.

In some embodiments, the facility receives a definition of a simulation model, such as via user input. In some embodiments, the definition of the simulation model includes information describing a complex whose operation is being simulated (a "simulated environment"). In some embodiments, the simulated environment represents one or more of: a warehouse, a medical facility, a factory, etc. In some embodiments, the information describing the simulated environment indicates one or more entities, and one or more paths for at least one of the one or more entities. In some embodiments, the facility includes information indicating an initial state of the simulation, such as whether each entity is a smart entity or a discrete entity, information describing the environment of the complex, or other information pertaining to an initial state of the simulation.

In some embodiments, the definition of the simulation model includes one or more constraints. In some embodiments, the one or more constraints relate to one or more of: one or more attributes of an entity, such as a location of the entity, a speed of the entity, a type of the entity; one or more interactions of the entity with another entity; the environment in the complex; a state of the simulation model; information obtained by the facility for the simulation model; an interaction of a user with the simulation model; a function call; etc.

In some embodiments, the facility uses multiple engines to manage the simulated environment, and each of the engines are used to manage a different aspect of the simulated environment. In some embodiments, a discrete engine is used to manage discrete entities in the simulated environment and a smart engine is used to manage smart entities in the simulated environment. In some embodiments, the facility maintains a list including information identifying which entities are smart entities under the control of the smart engine and which entities are discrete entities under the control of the discrete engine. In some embodiments, the information identifying the entities includes a location of each respective entity.

In some embodiments, the facility synchronizes the multiple engines, such as by using "ticks" or other units of time. In some embodiments, each engine simulates an aspect of the simulated environment for a predetermined number of ticks, and then waits until the other engines have completed simulating the simulated environment for the same number of ticks. In some embodiments, once each engine has completed its corresponding processes for the predetermined number of ticks, each engine shares with the other engines information related to the entities the engines manage. For example, when the predetermined number of ticks is ten, the smart engine manages each of the smart entities for ten ticks and waits until the discrete engine has managed each of the discrete entities for ten ticks. In this example, the smart engine and discrete engine then share the information related to the entities each engine manages after they have finished managing their corresponding entities for the ten ticks. In some embodiments, the predetermined number of ticks is configured via user input. In some embodiments, the predetermined number of ticks may be changed while the simulation is running.

In some embodiments, an engine determines when a synchronization between engines is required. In such embodiments, the engine may change the predetermined number of ticks so that a synchronization between engines happens sooner, happens later, happens immediately, etc. In such embodiments, an engine determines that a synchronization between engines is required based on one or more of: the definition of the simulation and data obtained by the engine regarding one or more entities controlled by the engine. For example, a discrete engine may determine that an entity it controls will transition before the time it should synchronize with a smart engine. The discrete engine may then communicate with the smart engine to change the number of ticks, the length of time for each tick, etc., to synchronize with the engine sooner. In such embodiments, the engine may determine how to change the length of time for each tick, the number of ticks, etc., based on the length of time that the entity was simulated before the engine determined that it should transition. For example, if the length of time for the tick is 10 seconds, and the engine simulated the movement of the entity for 5 seconds, then the engine may change the length of time for the tick to 5 seconds. In another example, if the engines process 3 ticks before synchronizing, and an entity is due to transition in the second tick, the engine may change the number of ticks before synchronizing to 2 ticks instead of 3 ticks.

In some embodiments, the facility maintains a shared data resource which includes information describing each of the entities. In some embodiments, each engine accesses the shared data resource to determine the location of each entity within the simulated environment, and whether the entity is a smart entity or a discrete entity. In some embodiments, each engine updates the shared data resource with the current status of entities managed by the engine.

In some embodiments, each engine determines which of the entities that the engine manages will be transitioned from smart entity status to discrete entity status, or vice versa. In some embodiments, an engine determines which entities will transition after each tick.

In some embodiments, an engine creates a list of entities which will transition from smart entity status to discrete entity status, or vice versa. In some embodiments, the facility sends the list of entities to another engine which will manage the entities in the list.

In some embodiments, the smart engine detects whether an entity has collided with another entity. In some embodiments, the smart engine records data pertaining to the collision, such as where the collision occurred, when the collision occurred, which entities collided, or other data pertaining to a collision between an entity and another entity, or the entity and the environment in the complex where the entity had a collision. In some embodiments, the smart engine detects whether an entity has collided with a discrete entity, a smart entity, or both.

In some embodiments, the smart engine includes a pathing engine used to determine how smart entities managed by the smart engine move. In some embodiments, the pathing engine projects a vector to determine a path for a smart entity.

By performing in some or all of the ways described above, the facility is able to quickly and reliably transition entities from smart entities to discrete entities, and allow simulation models to utilize both smart entities and discrete entities.

Also, the facility improves the functioning of computer or other hardware, such as by reducing the dynamic display area, processing, storage, and/or data transmission resources needed to perform a certain task, thereby enabling the task to be permitted by less capable, capacious, and/or expensive hardware devices, and/or be performed with lesser latency, and/or preserving more of the conserved resources for use in performing other tasks. For example, by using multiple engines to manage smart entities and discrete entities, the facility is able to more efficiently and more accurately simulate a complex which includes smart entities and discrete entities. Additionally, the facility is able to reduce the memory required to simulate a complex which includes smart entities and discrete entities.

FIG. 1 is a block diagram showing some of the components typically incorporated in at least some of the computer systems and other devices on which the facility operates. In various embodiments, these computer systems and other devices 100 can include server computer systems, cloud computing platforms or virtual machines in other configurations, desktop computer systems, laptop computer systems, netbooks, mobile phones, personal digital assistants, televisions, cameras, automobile computers, electronic media players, etc. In various embodiments, the computer systems and devices include zero or more of each of the following: a processor 101 for executing computer programs and/or training or applying machine learning models, such as a CPU, GPU, TPU, NNP, Neural Network Accelerator, FPGA, or ASIC; a computer memory 102 for storing programs and data while they are being used, including the facility and associated data, an operating system including a kernel, and device drivers; a persistent storage device 103, such as a hard drive or flash drive for persistently storing programs and data; a computer-readable media drive 104, such as a floppy, CD-ROM, or DVD drive, for reading programs and data stored on a computer-readable medium; a network connection 105 for connecting the computer system to other computer systems to send and/or receive data, such as via the Internet or another network and its networking hardware, such as switches, routers, repeaters, electrical cables and optical fibers, light emitters and receivers, radio transmitters and receivers, and the like; and a display connection 206 for causing visual information or data to be displayed to a user, such as a conceptual representation of a state of the simulation. While computer systems configured as described above are typically used to support the operation of the facility, those skilled in the art will appreciate that the facility may be implemented using devices of various types and configurations, and having various components.

Figure 2:
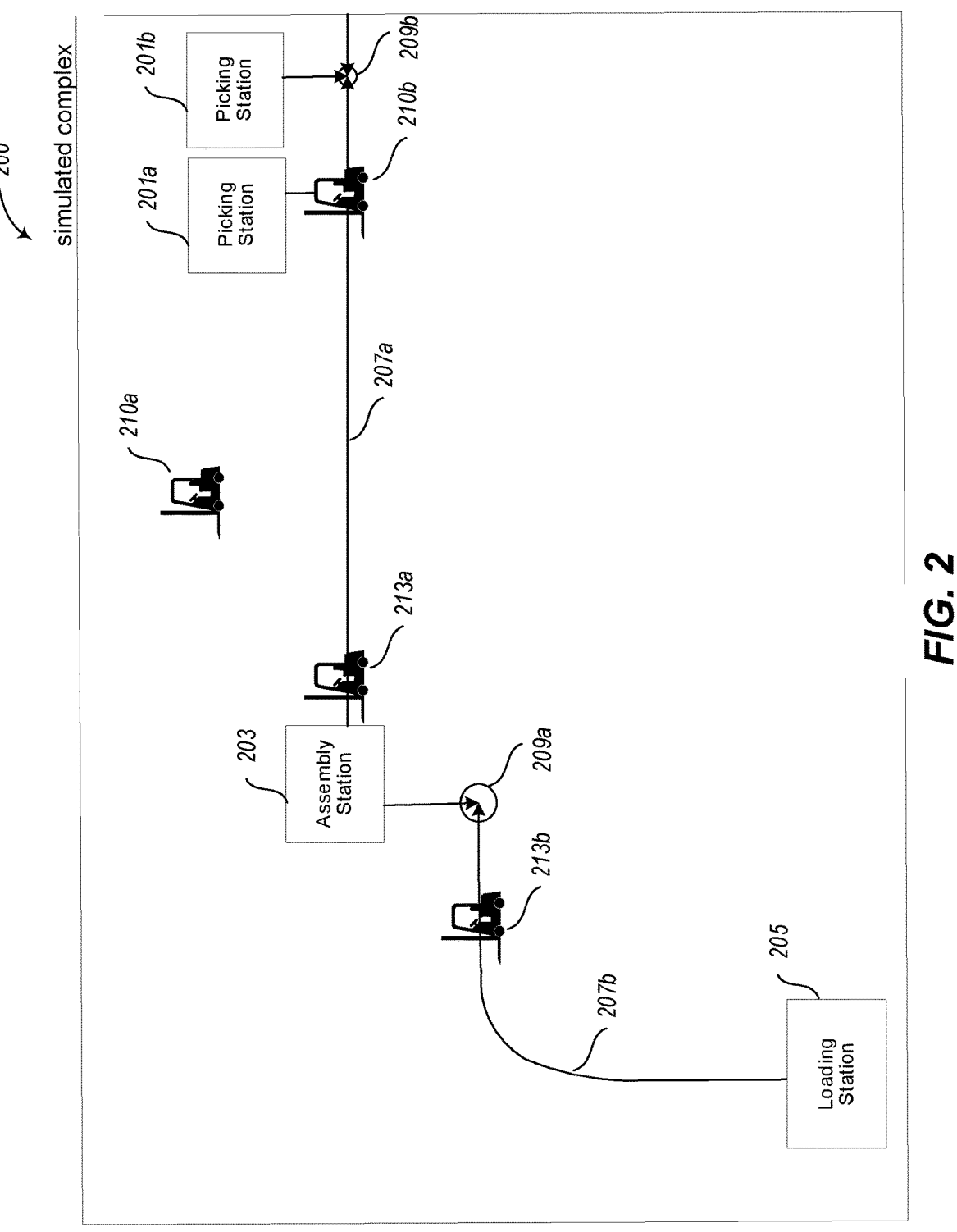
FIG. 2 is a display diagram showing a sample simulated complex used by the facility in some embodiments.

FIG. 2 is a display diagram showing a sample state of a simulated complex 200 which is displayed by the facility in some embodiments. The sample simulated complex 200 is generated by the facility to represent a complex, such as a factory, fulfillment center, medical complex, or other complex. In some embodiments, the facility generates the simulated complex 200 based on a definition of a simulation model, such as a simulation model provided via user input. In some embodiments, the definition of a simulation model includes one or more of: information describing the layout of the complex, one or more entities in the simulation model, an initial entity status for the one or more entities, and one or more transitioning constraints.

The simulated complex 200 includes picking stations 201a and 201b, an assembly station 203, a loading station 205, paths 207a and 207b, path connectors 209a and 209b, smart entities 210a and 210b, and discrete entities 213a and 213b. The picking stations 201a and 201b are used to simulate a station which an entity moves to in order to obtain an object carried by the entity. The assembly station 203 is used to simulate a station where an object is transformed into a new object. The loading station 205 is used to simulate a station where an object is loaded onto a vehicle which takes the object to a location outside of the facility. Paths 207a and 207b denote pre-defined paths taken by entities when moving between the various stations included in the simulated complex. In some embodiments, the facility receives user input defining the paths. In some embodiments, the facility automatically generates the paths between the various stations. The path connectors 209a and 209b denote intersections of two or more paths.

During a simulation of the complex, one or more simulation engines simulate the movement of the smart entities 210a and 210b between the various stations. The smart entities 210a and 210b move from one station to the next without needing to follow either of the paths 207a and 207b. The simulation engines determine the route that the smart entities 210a and 210b take based on the environment in the simulated complex. For example, the environment may include walls, shelves, doorways, other entities, etc., which the simulation engine may take into account when determining the route taken by the smart entities 210a and 210b. In some embodiments, the simulation engine additionally takes into account dimensions for an entity and dimensions for the environment around the entity to determine the route that the entity takes. As an example, an entity may be five inches tall and a shelf may be elevated one foot off of the ground. Thus, the entity is able to move under the shelf because it is shorter than the total amount of space between the shelf and the ground, and the simulation engine may take this factor into account when determining the route taken by the smart entity. In some embodiments, an entity's dimensions may change after it has taken on a load, such as when an entity picks up a pallet. In such an embodiment, an entity without a load may be able to move beneath a rack, however once the entity has taken on the load it may be unable to move beneath the rack because of the change in the entity's dimensions after taking on the load. Additionally, when the entity unloads the pallet the dimensions of the entity may change to reflect the removal of the pallet, thereby allowing the entity to move beneath the rack after the pallet is unloaded. In some embodiments, a smart engine may determine a route for a smart entity by projecting vectors for the entity in the direction that the entity needs to go. In some embodiments, the length of the projected vectors are determined based on a travel speed of the entity and the length of time, or the tick, that the engine is simulating.

During simulation of the complex, one or more simulation engines simulate the movement of the discrete entities 213a and 213b between the various stations. The discrete entities 213a and 213b move from one station to the next by following the paths 207a and 207b. Thus, the simulation engines determine the routes for the discrete entities 213a and 213b based on the destination of the respective entity and the available paths which may be taken to reach that destination.

Figure 3:
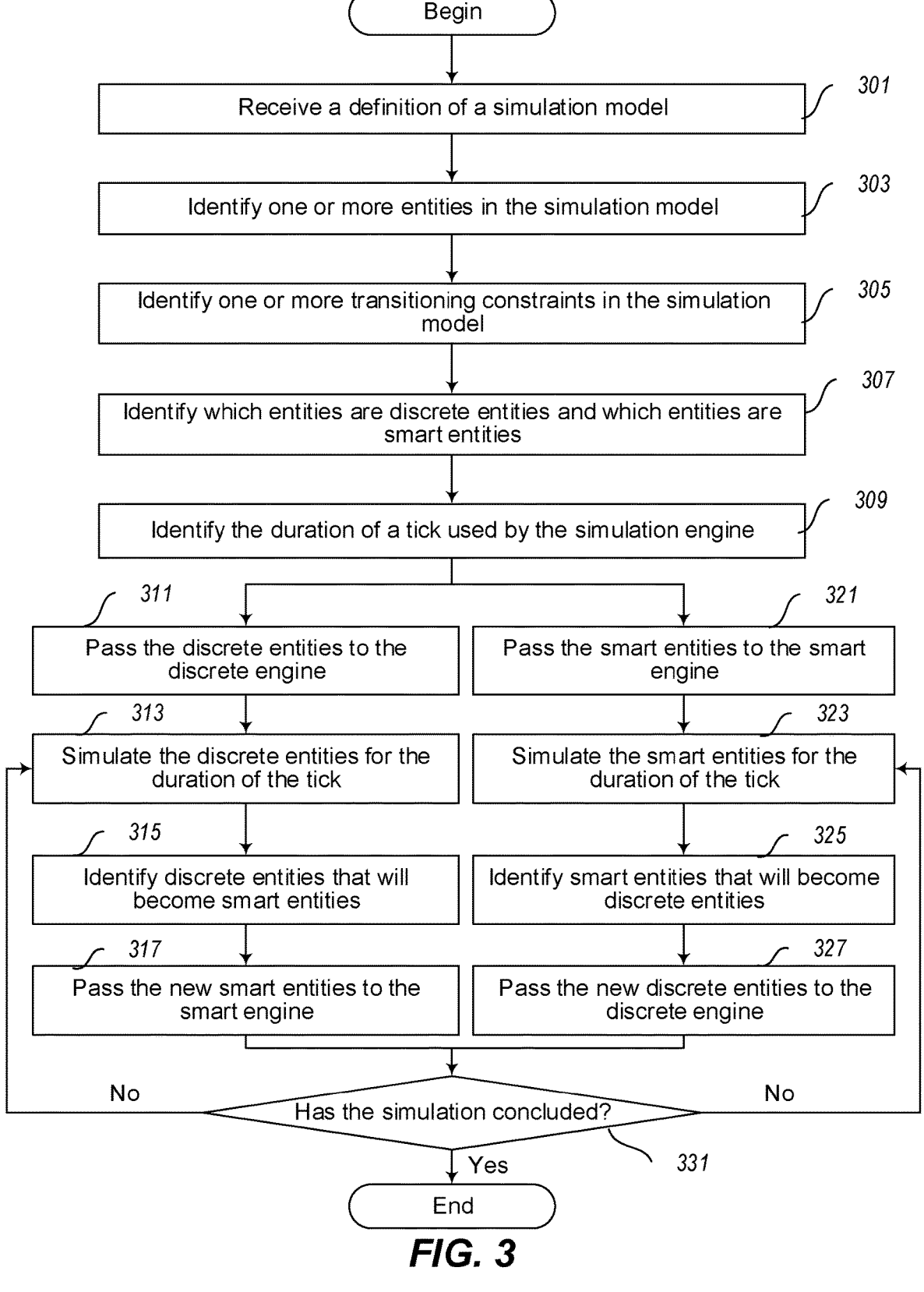
FIG. 3 is a flow diagram of a process to transition entities between smart entity status and discrete entity status, used by the facility in some embodiments.

FIG. 3 is a flow diagram of a process to transition entities between smart entity status and discrete entity status, used by the facility in some embodiments. First, at act 301, the facility receives a definition of a simulation model. In some embodiments, the definition of the simulation model includes one or more of: information describing the environment of a complex, information describing entities in the complex, information describing stations in the complex, information describing paths in the complex, information describing transitioning constraints, and other information related to the simulation of a complex. In some embodiments, the facility receives the definition of the simulation model via user input. In some embodiments, the facility provides the user with a user interface which allows a user to create the definition of the simulation model. In some embodiments, the transitioning constraints include one or more of: a change in an attribute of an entity, a location of an entity, user input, a change in an attribute of the simulated complex, a simulated object which the entity interacts with, a collision between the entity and at least one other entity, a code function specified by a user, and other constraints or rules which may be used to determine that an entity's status should be changed.

For example, for an entity that is a battery operated AGV, the AGV may act as a smart entity while it has over ten percent of its battery power remaining. Once the AGV's battery power falls below ten percent, it is transitioned to a discrete entity which follows a predetermined path to a charging station. Then, after the AGV has is fully charged it is transitioned back to a smart entity. Thus, in this example a transition constraint for the AGV is to transition to a discrete entity when battery power is below ten percent, and to transition to a smart entity when the batter power is fully charged.

In another example, a picker, that is, a worker whose job is moving to and from storage racks to pick items off of the racks and take them to a destination, may be classified as a discrete entity until the picker picks up an item. After picking up the item, the picker may be transitioned to a smart entity which moves directly to the item's destination. Once the picker places the item at its destination, the picker transitions back into a discrete entity and follows a path to another item. Thus, in this example, a transition constraint for the picker is based on whether the picker is carrying an item.

In another example, a small AGV may be able to move underneath racks in the complex, and may act as a smart entity while it is not carrying an item. When the small AGV picks an item off of the rack it is unable to move underneath them, and it transitions to a discrete entity. After the item is removed from the AGV it transitions back to being a smart entity. Thus, the transition constraint for the AGV is based on whether the AGV is carrying an item. Furthermore, the spatial dimensions of the AGV may change based on whether the AGV is carrying the item in order to include the spatial dimensions of the item, and the AGV's route as a discrete entity may change based on the type of item carried and the change in spatial dimensions of the AGV which is caused by carrying the item.

In another example, a user viewing the execution of the simulation may want to see how a forklift currently acting as a smart entity interacts with other entities when the forklift is treated as a smart entity. The user accesses a user interface and designates the forklift as a smart entity, causing the transition of the forklift from a discrete entity to a smart entity. Thus, in this example, the transition constraint is based on user input while the simulation is running.

In another example, a forklift classified as a discrete entity may enter an open area within the simulated complex. Upon entrance into the open area, the forklift may be transitioned to a smart entity so that it may navigate through the open area towards its destination without having to follow a set path. Thus, in this example, the transition constraint is based on the entity's location being within a designated area.

At act 303, the facility identifies one or more entities in the simulation model. At act 305, the facility identifies one or more transitioning constraints in the simulation model.

At act 307, the facility identifies which entities in the simulation model are discrete entities and which entities are smart entities in the initial state of the simulation model. As the facility executes the simulation model the status of the entities may be changed. In some embodiments, the initial status is a discrete entity status, identifying the entity as a discrete entity, or a smart entity status, identifying the entity as a smart entity. In some embodiments, the initial status of the entities is included in the definition of the simulation model.

At act 309, the facility identifies the duration of a tick used by the simulation engine. In some embodiments, the duration of a tick is included in the definition of the simulation model. In some embodiments, the duration of the tick can be changed while the simulation is executing.

At act 311, the facility passes the discrete entities to the discrete engine. At act 313 the facility simulates the discrete entities for the duration of the tick by using the discrete engine. At act 315, the facility identifies discrete entities that will become smart entities based on the transitioning constraints. At act 317, the facility passes the new smart entities to the smart engine.

At act 321, the facility passes the smart entities to the smart engine. At act 323, the facility simulates the smart entities for the duration of the tick by using the smart engine. At act 325, the facility identifies smart entities that will become discrete entities based on the transitioning constraints. At act 327, the facility passes the new discrete entities to the discrete engine.

In some embodiments, at acts 315 and 325, the facility determines whether it has received additional user input indicating that an entity should transition from a discrete entity to a smart entity, or vice versa. Based on a determination that the facility has received additional user input indicating that the entity should transition, the facility identifies the entity as an entity that will transition in act 317 or 327 respectively.

In some embodiments, acts 327 and 317 are performed by using engine entity tables. FIG. 4a is a table diagram depicting a table of entities transitioning from discrete to smart 400 (a "discrete engine transition table") used by the facility in some embodiments. The discrete engine transition table 400 includes an entity id column 420. The entity id column 420 includes information identifying an entity controlled by the discrete engine which will transition from discrete status to smart status. For example, in the example depicted in FIG. 4a, rows 401 and 402 indicate that entities 1111 and 2222 will transition to a smart engine. Entities which are controlled by the discrete engine and are not shown in the discrete engine transition table 400 do not transition to the smart engine.

FIG. 4b is a table diagram depicting a table of entities transitioning from smart to discrete 450 (a "smart engine transition table") used by the facility in some embodiments. The smart engine transition table includes an entity id column 470. The entity id column 470 includes information identifying an entity controlled by the smart engine which will transition from smart status to discrete status. For example, in the example depicted in FIG. 4b, rows 451, 454, and 455 indicate that entities 6666, 9999, and 1010 will transition to a discrete engine. Entities which are controlled by the smart engine and are not shown in the smart engine transition table 450 do not transition to the discrete engine.

In some embodiments, the discrete engine transition table and smart engine transition table include additional data describing each entity, such as the location of the entity. In such embodiments, an engine passes the entity identifier as well as the entities current location to another engine if the entity is identified as one which will transition.

While FIGS. 4a, 4b, and each of the table diagrams discussed below show a table whose contents and organization are designed to make them more comprehensible by a human reader, those skilled in the art will appreciate that actual data structures used by the facility to store this information may differ from the table shown, in that they, for example, may be organized in a different manner; may contain more or less information than shown; may be compressed, encrypted, and/or indexed; may contain a much larger number of rows than shown, etc.

Returning to FIG. 3, at act 331, the facility determines whether the simulation has concluded. If the simulation has not concluded, the process returns to acts 313 and 323. If the simulation has concluded, the process ends.

In some embodiments, at act 331, if the simulation has not concluded, the facility performs acts 313 through 317 simultaneously with acts 323 through 327, such that both sets of acts are performed by the respective engines before the process returns to act 313 or 323 respectively. For example, if act 317 has been completed by the discrete engine but act 327 has not been completed by the smart engine, the process will not proceed to act 313 until act 327 has been completed as well. In this manner, and in some embodiments, the facility is able to perform acts 313 through 317 sequentially with acts 323 through 327. Additionally, in some embodiments, the facility is able to perform acts 313 through 317 simultaneously with acts 323 through 327.

Those skilled in the art will appreciate that the acts shown in FIG. 3 and in each of the flow diagrams discussed below may be altered in a variety of ways. For example, the order of the acts may be rearranged; some acts may be performed in parallel; shown acts may be omitted, or other acts may be included; a shown act may be divided into subacts, or multiple shown acts may be combined into a single act, etc.

Figure 5:
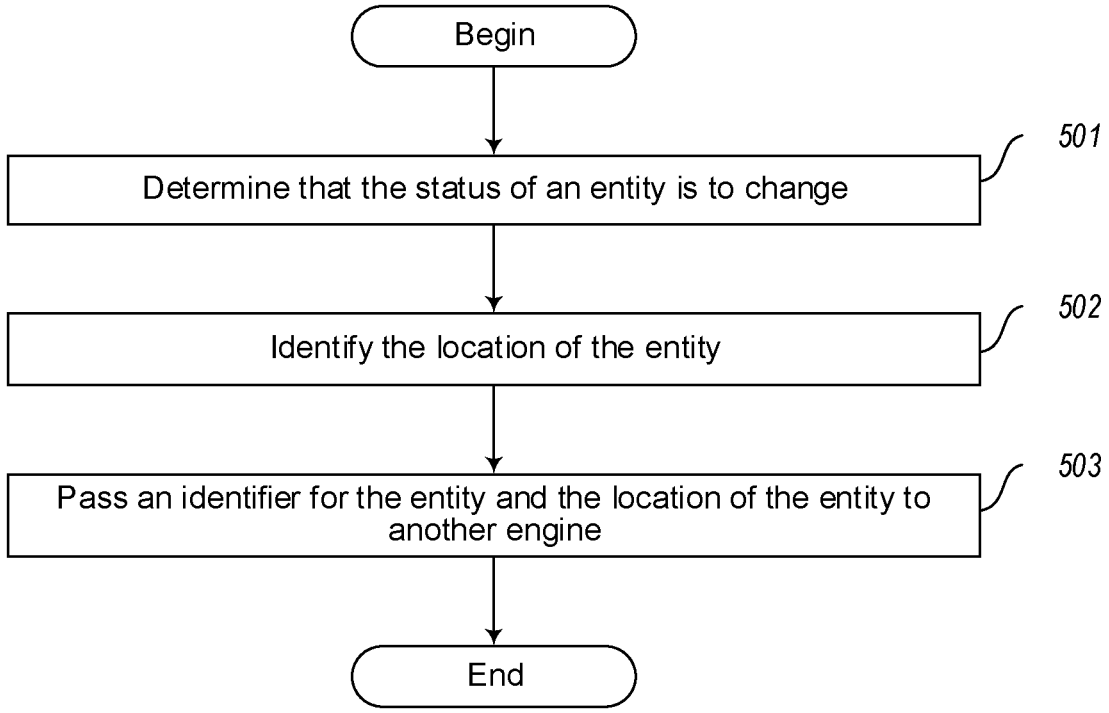
FIG. 5 is a flow diagram of a process to transition an entity from one engine to another, used by the facility in some embodiments.

FIG. 5 is a flow diagram of a process to transition an entity from one engine to another, used by the facility in some embodiments. First, at act 501, the engine with control over the entity determines that the status of an entity is to change. In some embodiments, the engine determines that the status of the entity is to change by evaluating one or more transitioning constraints which apply to the entity. At act 502, the engine identifies the location of the entity. At act 503, the engine passes an identifier for the entity and the location of the entity to another engine. In some embodiments, the identifier for the entity is a pointer. In some embodiments, the engine compiles a list of entities which will change in status and passes the list of entities to the other engine.

FIG. 6 is a table diagram depicting a shared engine data table used by the facility in some embodiments. The shared engine data table includes an entity ID column 620, a location column 521, an entity type column 622, an entity attributes column 623, and an entity transition constraints column 624. The entity id column 620 includes information used to identify a specific entity. In some embodiments, the information used to identify the entity includes a pointer to a section of memory which stores data related to the entity. The location column 621 includes information identifying the current location of the entity during execution of the simulation. The entity type column 622 includes information identifying the type of entity that the entity is, such as a forklift, picker, AGV, or another type of entity represented in the simulation. The entity attributes column 623 includes information identifying one or more attributes of the entity, such as a size, collision radius, speed, load capacity, battery capacity, or other attributes used to describe an entity. The entity transition constraints column 624 includes information identifying one or more transition constraints for the entity identified in column, such as a destination of the entity, entry into or exit from an area in the complex, after a time period has elapsed, a change in an attribute of the entity, a load that the entity carries, or other constraints that may be used to indicate that an entity's status should change.

For example, row 601 indicates that entity 1111 is an AGV and will transition to a smart entity status when moving to or from the picking station. However, when the battery level of entity 1111 is under 20 minutes or it is moving from the assembly station to the loading station, it will transition to a discrete entity status.

Figure 7:
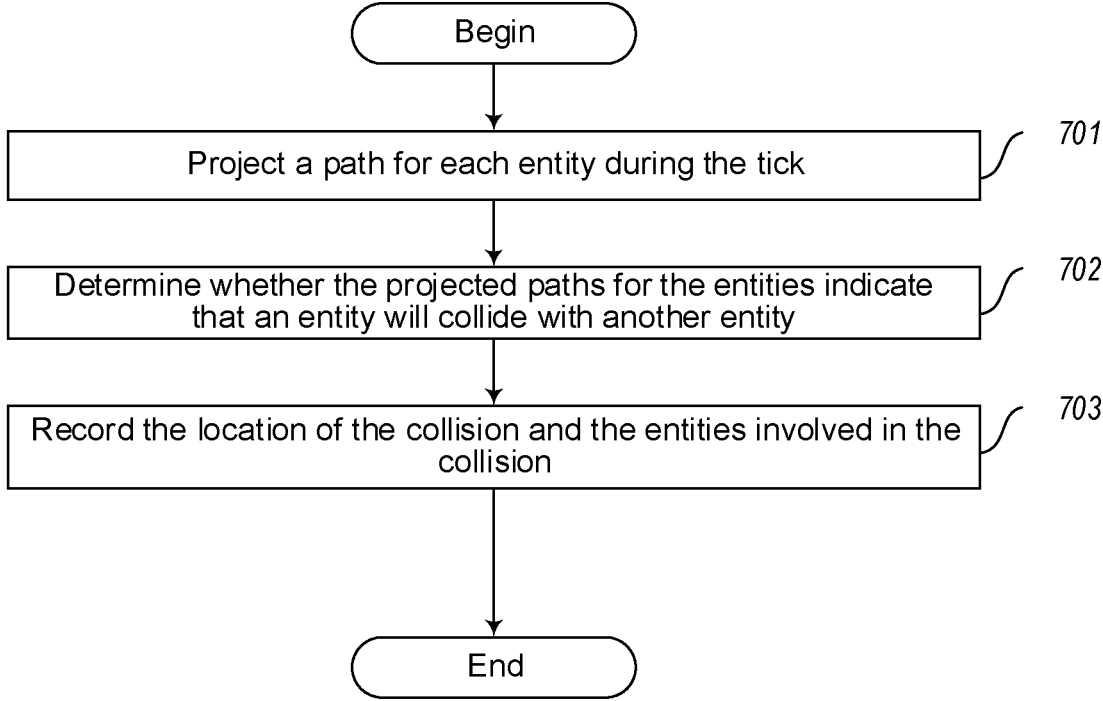
FIG. 7 is a flow diagram of a process to simulate the movement of an entity and track collisions between entities that occur as a result of the simulated movement, used by the facility in some embodiments.

FIG. 7 is a flow diagram of a process to simulate the movement of an entity and track collisions between entities that occur as a result of the simulated movement, used by the facility in some embodiments. First, at act 701, the engine projects a path for each entity it controls during the tick. In some embodiments, when the engine is a smart engine, the smart engine projects a vector towards the entity's destination based on the environment of the complex around the entity, the speed of the entity, the current location of the entity, and the destination of the entity. In such embodiments, the smart engine may project the vector, determine whether projected vector would cause a collision between the entity and a part of the environment, and change the vector until the projected vector would not cause a collision between the entity and a part of the environment. In some embodiments, the smart engine may receive information describing how an entity moves while it has a smart entity status, and may simulate the movement of the entity based on the received information. In some embodiments, when the engine is a discrete engine, the discrete engine projects the path for the entity during the tick based on a predetermined path and the speed of the entity.

At act 702, the engine determines whether the projected paths for the entities indicate that an entity will collide with another entity. In some embodiments, the engine uses a collision radius for each entity to determine whether the entity will collide with another entity. At act 703, the engine records the location of the collision and the entities involved in the collision in a collision data table. After act 703, the process ends.

Figure 8:
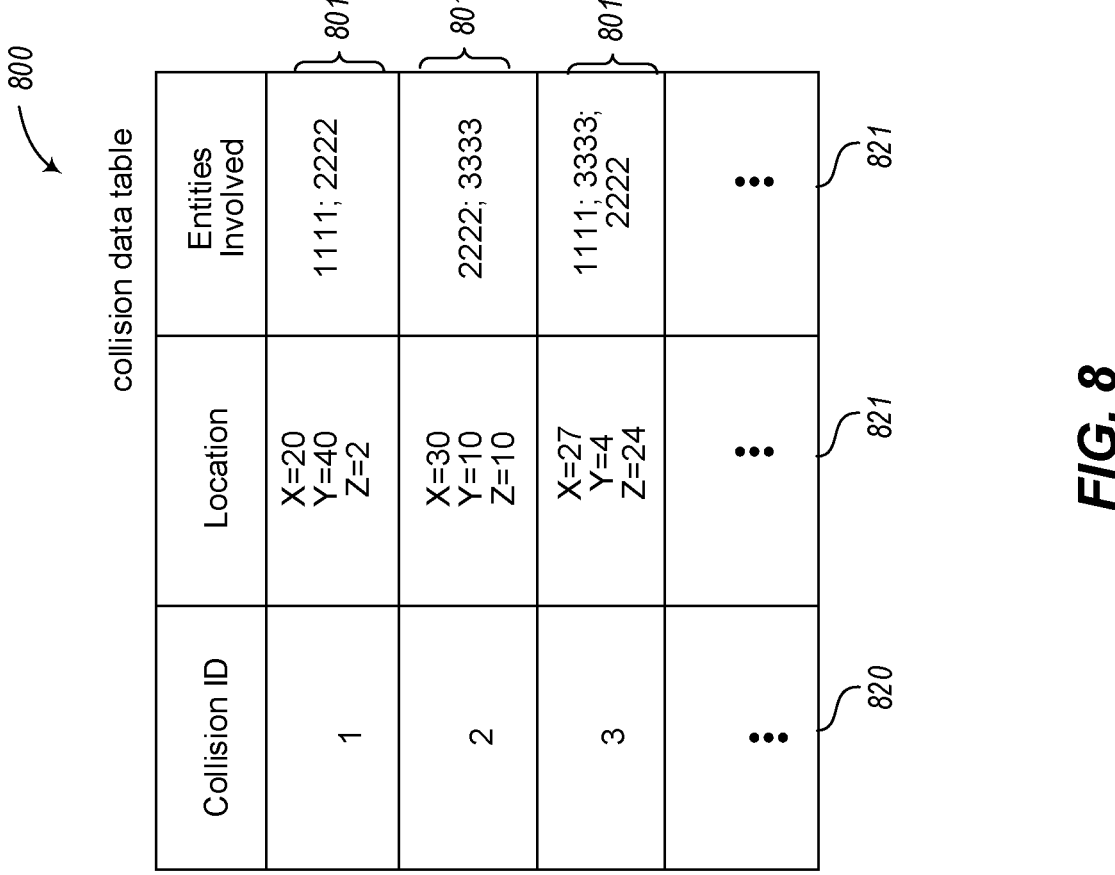
FIG. 8 is a table diagram depicting a collision data table used by the facility in some embodiments.

FIG. 8 is a table diagram depicting a collision data table used by the facility in some embodiments. The collision data table includes a collision ID column 820, a location column 821, and an entities involved column 822. In some embodiments, the collision data table includes additional information regarding the collision, such as, for example, the time in the simulation that the collision occurred, the status of the entities, attributes of the entities during the collision, data regarding the state of the simulation model as a whole during the collision, etc. The collision ID column 820 includes information identifying the collision that has been recorded. The location column 821 includes information identifying where the collision occurred. The entities involved column 822 includes information identifying the entities involved in the collision. For example, row 801 includes information identifying a collision between entities 1111 and 2222 at coordinates (20, 40, 2). Likewise row 803 includes information identifying a collision between entities 1111, 3333, and 2222 at coordinates (27, 4, 24). In some embodiments, the facility is able to use the data stored in the collision data table to display the collisions to a user. In some embodiments, the facility displays the collisions to the user while the simulation is being executed. In some embodiments, the facility displays the collisions on the simulation itself so that the user can see each collision occur in the simulation while it is being executed. In some embodiments, the facility can replay the collisions to the user after the simulation has completed.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. One or more instances of computer-readable media collectively having contents configured to cause a computing device to perform a method for controlling the transition of entities between a smart entity status and a discrete entity status in a simulation model, the method comprising:

obtaining an indication of a simulation model representing a complex;

identifying one or more transitioning constraints in the simulation model;

identifying one or more entities in the simulation model, each identified entity having an initial entity status identifying the entity as having a discrete entity status or a smart entity status, wherein:

an entity having a discrete entity status is an entity that follows a set path to its next destination; and an entity having a smart entity status is an entity that is able to travel to its next destination without following a set path; and implementing the simulation model to simulate the movement of the identified entities within the simulation model by implementing a plurality of simulation engines, by:

simulating the movement of at least a portion of the entities having a discrete entity status via a first simulation engine of the plurality of simulation engines;

simulating the movement of at least a portion of the entities having a smart entity status via a second simulation engine of the plurality of simulation engines;

determining that the status of a distinguished entity among the identified entities should change based on the transitioning constraints; and in response to the determining, changing the status of the distinguished entity.

2. The one or more instances of computer-readable media of claim 1, wherein simulating the movement of the one or more entities is performed by implementing the plurality of simulation engines, such that, one or more simulation engines of the plurality of simulation engines are discrete engines configured to simulate the movement of discrete entities, one or more simulation engines of the plurality of simulation engines are smart engines configured to simulate the movement of smart entities, and the determination that the status the distinguished entity should be changed is obtained by the simulation engine simulating the movement of the distinguished entity.

3. The one or more instances of computer-readable media of claim 2, wherein implementing the plurality of simulation engines further comprises:

identifying a length of time for a tick based on the indication of the simulation model; and simulating the movement of the identified entities for one tick in each of the smart engines and each of the discrete engines.

4. The one or more instances of computer-readable media of claim 3, wherein the determination that the status of the distinguished entity should be changed is obtained after the respective simulation engine simulates the movement of one or more entities for one tick.

5. The one or more instances of computer-readable media of claim 4, wherein changing the status of the distinguished entity further comprises:

generating a list of entities, the list of entities including at least one entity which a first simulation engine of the plurality of simulation engines has determined should change status; and providing, by the first simulation engine, the generated list of entities to a second simulation engine of the plurality of simulation engines.

6. The one or more instances of computer-readable media of claim 3, wherein identifying a length of time for a tick further comprises:

determining, by the first simulation engine of the plurality of simulation engines, that the length of time for the tick should be changed based on a determination that the status of the distinguished entity should change before the first simulation engine has completed simulating the movement of the identified entities for the length of time for the tick; and based on the determining, changing the length of time for the tick.

7. The one or more instances of computer-readable media of claim 3, wherein identifying a length of time for a tick further comprises:

determining, by the first simulation engine of the plurality of simulation engines, that the length of time for the tick should be changed based on a determination that the status of the distinguished entity should change before the first simulation engine has completed simulating the movement of the identified entities for the length of time for the tick;

determining a new length of time for the tick; and based on the determining, changing the length of time for the tick to the new length of time for the tick.

8. The one or more instances of computer-readable media of claim 2, wherein implementing the plurality of simulation engines further comprises:

identifying a data resource, the data resource including data describing each entity of the one or more entities; and causing each simulation engine to access the data resource while simulating the movement of the one or more entities.

9. The one or more instances of computer-readable media of claim 2, simulating the movement of smart entities by a smart engine further comprises:

determining whether a smart entity simulated by the smart engine has collided with at least one other entity of the one or more entities; and in response to a determination that the smart entity has collided with at least one other entity of the one or more entities, recording data describing the collision of the smart entity with the at least one other entity.

10. The one or more instances of computer-readable media of claim 1, wherein the transitioning constraints include one or more of: a change in an attribute of an entity, a location of an entity, user input, a change in an attribute of the simulated complex, a simulated object which the entity interacts with, a collision between the entity and at least one other entity, and a code function specified by a user.

11. The one or more instances of computer-readable media of claim 10, wherein the transitioning constraints include one or more of: a determination that the distinguished entity has interacted with an item, a determination that a user has indicated the status of the distinguished entity should change, a determination that the entity has entered a predefined area within the simulated complex, and a determination that the entity has a low battery charge.

12. The one or more instances of computer-readable media of claim 1, wherein an entity represents one or more of: a vehicle, a person, and an object.

13. The one or more instances of computer-readable media of claim 1, the method further comprising:

before the changing, simulating the distinguished entity as a discrete entity; and after the changing, simulating the distinguished entity as a smart entity.

14. The one or more instances of computer-readable media of claim 1, the method further comprising:

before the changing, simulating the distinguished entity as a smart entity; and after the changing, simulating the distinguished entity as a discrete entity.

15. A system for creating a simulation model which includes entities that transition between a smart entity status and a discrete entity status while the simulation model is being implemented, the method comprising:

a computing device configured to:

receive user input defining a simulation model representing a complex, wherein the definition of a simulation model comprises:

information describing the layout of the complex;

one or more entities in the simulation model;

an initial entity status for each entity of the one or more entities wherein the entity status identifies the entity as having a discrete entity status or a smart entity status and wherein:

an entity having a discrete entity status is an entity that follows a set path to its next destination; and an entity having a smart entity status is an entity that is able to travel to its next destination without following a set path; and one or more transitioning constraints which specify circumstances in which an entity should be transitioned from one entity status to another entity status;

generate the simulation model based on the received definition, such that upon execution of the simulation model to simulate the movement of the defined entities, the computing device is caused to:

simulate the movement of at least a portion of the entities having a discrete entity status via a first simulation engine of a plurality of simulation engines;

simulate the movement of at least a portion of the entities having a smart entity status via a second simulation engine of the plurality of simulation engines;

determine that the status of a distinguished entity among the defined entities should change based on one or more transitioning constraints; and in response to the determining, change the status of the distinguished entity.

16. The system of claim 15, wherein the user input further indicates a length of time for a tick, and the computing device is caused to determine whether the status of the distinguished entity should change after simulating the movement of the defined entities for at least one tick.

17. The system of claim 15, wherein the computing device is further configured to:

receive, while the computing device is executing the model, user input indicating that one or more attributes of at least one entity is to be altered; and altering, while the computing device is executing the model, the one or more attributes of the at least one entity.

18. The system of claim 17, wherein at least one altered attribute of the at least one entity is the status of the entity.

19. The system of claim 15, wherein the computing device is further caused to:

determine whether a first entity has collided with a second entity during the execution of the simulation model;

record data describing the collision of the first entity with the second entity; and present at least a portion of the data describing the collision of the first entity with the second entity to a user.

20. One or more storage devices collectively storing an entity transition data structure, the data structure comprising:

information specifying a simulation model, including:

information specifying one or more entities, including an initial entity status identifying each entity as having a discrete entity status or a smart entity status wherein:

an entity having a discrete entity status is an entity that follows a set path to its next destination; and an entity having a smart entity status is an entity that is able to travel to its next destination without following a set path; and information specifying one or more transition constraints, such that, the information specifying one or more transition constraints are usable by a computing device implementing the simulation model to identify points in time at which the status of a distinguished entity of the specified entities should be changed.

21. The one or more storage devices of claim 20, wherein the information specifying the simulation model further includes:

information specifying a length of time for a tick, such that, the computing device implementing the simulation model identifies points in time at which the status of the distinguished entity should be changed after the computing device has used the simulation model to simulate the movement of the specified entities for the length of time represented by the tick.

22. The one or more storage devices of claim 20, wherein the data structure further comprises:

information specifying one or more collisions involving one or more entities during the implementation of the simulation model.

23. The one or more storage devices of claim 20, wherein the data structure further comprises:

information specifying one or more smart engines configured to simulate the movement of smart entities;

information specifying one or more discrete engines configured to simulate the movement of discrete entities; and information specifying one or more entities which will change in status, such that, the information specifying one or more entities which will change in status is usable to transition the one or more entities which will change status to a smart engine or a discrete engine.

24. The one or more storage devices of claim 20, wherein the data structure further comprises:

information specifying one or more smart engines configured to simulate the movement of smart entities;

information specifying one or more discrete engines configured to simulate the movement of discrete entities; and information specifying a data structure which includes information describing attributes for at least one entity of the one or more entities, such that, the one or more smart engines and the one or more discrete engines are able to access the data structure which includes information describing attributes for at least one entity of the one or more entities.

* * * * *